(12) United States Patent
Lis

(10) Patent No.: US 12,334,458 B2
(45) Date of Patent: Jun. 17, 2025

(54) PACKAGE WITH PAD HAVING OPEN NOTCH

(71) Applicant: Infineon Technologies AG, Neubiberg (DE)

(72) Inventor: Adrian Lis, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 542 days.

(21) Appl. No.: 17/487,682

(22) Filed: Sep. 28, 2021

(65) Prior Publication Data

US 2022/0102299 A1    Mar. 31, 2022

(30) Foreign Application Priority Data

Sep. 29, 2020   (DE) .................... 10 2020 125 371.0

(51) Int. Cl.
*H01L 23/367*   (2006.01)
*H01L 21/50*    (2006.01)
*H01L 23/00*    (2006.01)

(52) U.S. Cl.
CPC .............. *H01L 24/05* (2013.01); *H01L 21/50* (2013.01); *H01L 23/367* (2013.01); *H01L 2224/05552* (2013.01); *H01L 2224/05553* (2013.01); *H01L 2224/05554* (2013.01); *H01L 2224/05555* (2013.01)

(58) Field of Classification Search
CPC ...................................................... H01L 24/05
See application file for complete search history.

(56) References Cited

U.S. PATENT DOCUMENTS

| | | | |
|---|---|---|---|
| 5,661,315 A * | 8/1997 | Bauer ................ | H01L 29/4238 257/E29.198 |
| 5,777,366 A * | 7/1998 | Contiero ............ | H01L 29/7816 257/493 |
| 6,400,014 B1 * | 6/2002 | Huang ................ | H01L 23/4334 257/E23.092 |
| 6,407,922 B1 | 6/2002 | Eckblad et al. | |
| 6,873,045 B2 | 3/2005 | Yoshizaki et al. | |
| 7,319,264 B2 * | 1/2008 | Narazaki ................ | H01L 24/73 257/E23.079 |
| 7,968,982 B2 * | 6/2011 | Wu ........................ | H01L 24/97 257/796 |
| 8,362,606 B2 | 1/2013 | Ho et al. | |
| 8,431,998 B2 | 4/2013 | Miyata | |
| 9,691,713 B2 * | 6/2017 | Sugiura ............... | H01L 23/4824 |
| 9,698,221 B2 | 7/2017 | Sugawara et al. | |
| 10,290,566 B2 | 5/2019 | Otremba et al. | |
| 10,535,587 B2 * | 1/2020 | Privitera ........... | H01L 23/49524 |
| 2004/0012064 A1 | 1/2004 | Ochiai et al. | |

(Continued)

FOREIGN PATENT DOCUMENTS

| | | |
|---|---|---|
| CN | 101794779 | 8/2010 |
| CN | 102347299 | 2/2012 |

(Continued)

*Primary Examiner* — William A Harriston
(74) *Attorney, Agent, or Firm* — Dicke, Billig & Czaja, PLLC

(57) ABSTRACT

A package is disclosed. In one example, the package comprises an electronic component having a first main surface with an electrically conductive first pad. The first pad has an open notch, and a spacer body mounted on the first pad and bridging at least part of the open notch.

14 Claims, 4 Drawing Sheets

(56) References Cited

U.S. PATENT DOCUMENTS

| | | | |
|---|---|---|---|
| 2006/0220180 A1* | 10/2006 | Takahashi | H01L 23/49562 257/E23.044 |
| 2007/0001265 A1* | 1/2007 | Narazaki | H01L 24/37 257/E23.044 |
| 2009/0116197 A1 | 5/2009 | Funakoshi et al. | |
| 2013/0082334 A1 | 4/2013 | Nakamura et al. | |
| 2013/0154155 A1* | 6/2013 | Casabianca | H01L 21/565 264/261 |
| 2014/0339650 A1* | 11/2014 | Smith | H01L 29/0653 257/409 |
| 2017/0025336 A1 | 1/2017 | Padmanabhan et al. | |
| 2017/0174301 A1 | 6/2017 | Morimoto | |
| 2018/0096991 A1* | 4/2018 | Nasu | H01L 27/0255 |
| 2018/0157297 A1 | 6/2018 | Delano et al. | |
| 2018/0261532 A1 | 9/2018 | Takahagi et al. | |
| 2019/0221496 A1 | 7/2019 | Tsuchimochi | |
| 2020/0024695 A1 | 1/2020 | Kakitani | |
| 2020/0227405 A1* | 7/2020 | Shinsho | H01L 29/7395 |
| 2020/0243505 A1* | 7/2020 | Weyers | H01L 29/7808 |
| 2023/0307538 A1* | 9/2023 | Altstätter | H01L 29/407 |

FOREIGN PATENT DOCUMENTS

| | | |
|---|---|---|
| CN | 105448901 | 3/2016 |
| CN | 106463539 | 2/2017 |
| DE | 10 2006 015 112 | 1/2007 |
| DE | 60317270 | 8/2008 |
| JP | 2014-3095 | 1/2014 |
| JP | 2017-54877 | 3/2017 |
| JP | 2017054877 | 3/2017 |

\* cited by examiner

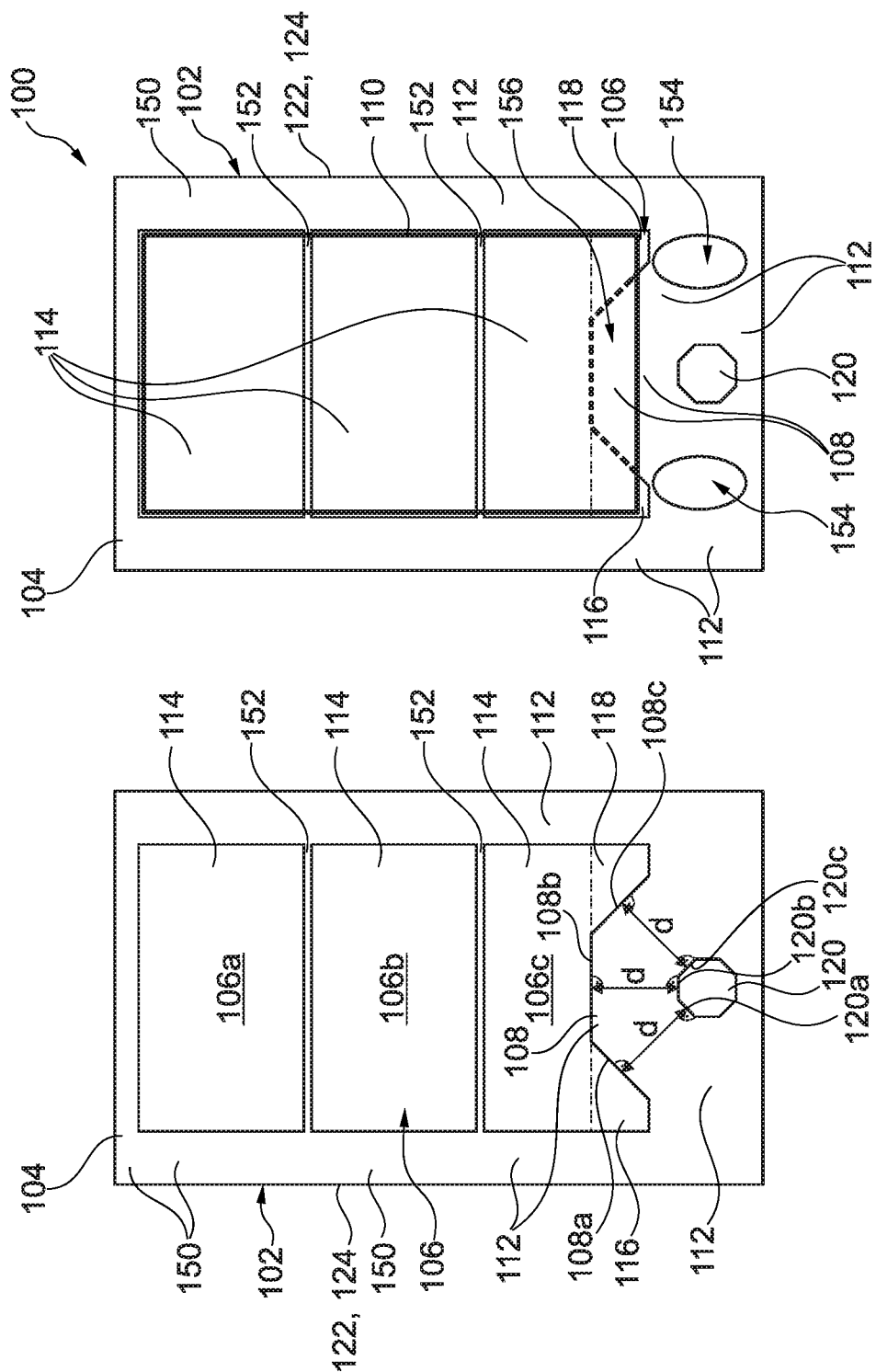

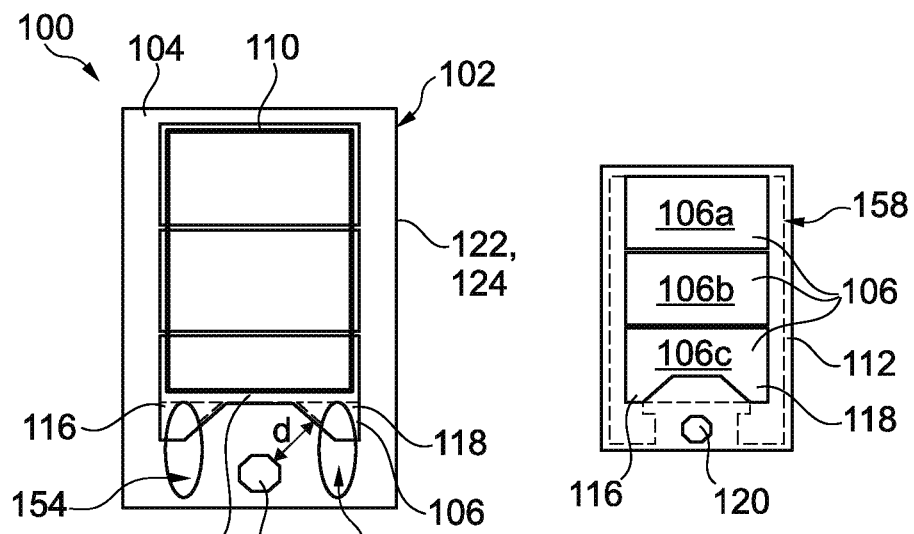
Fig. 3
Fig. 4
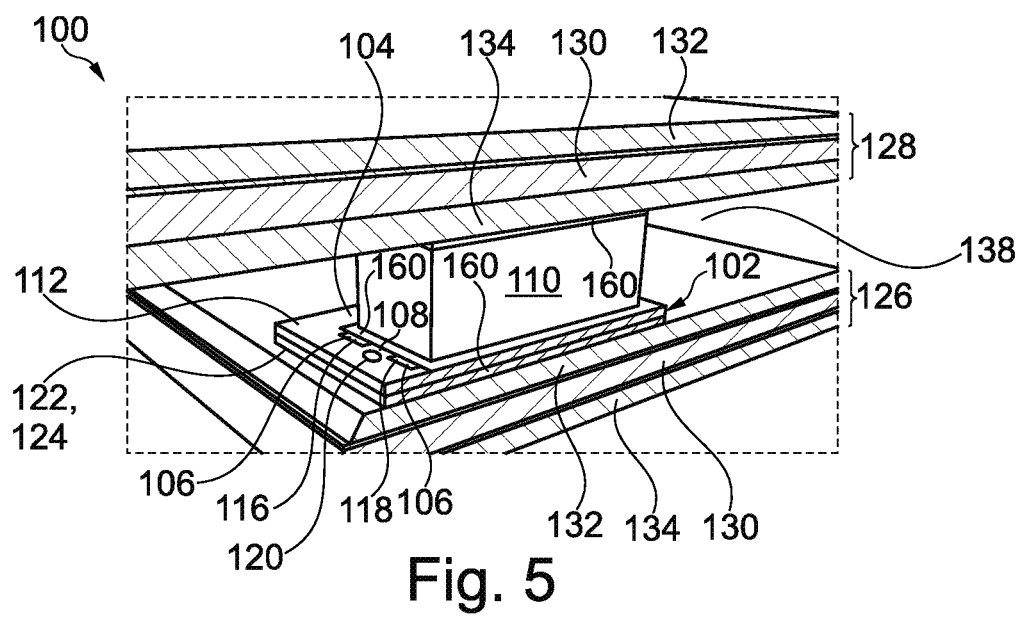
Fig. 5
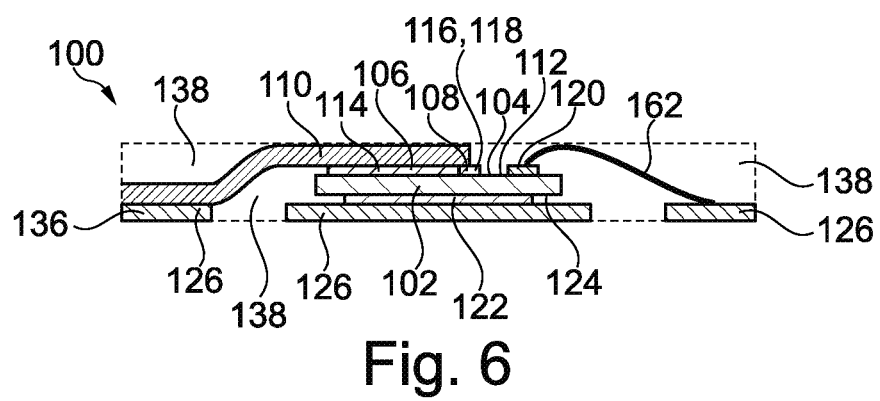
Fig. 6

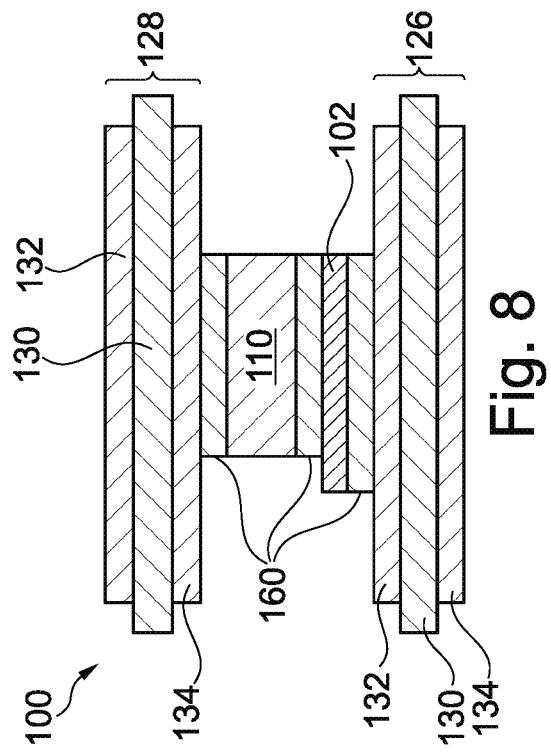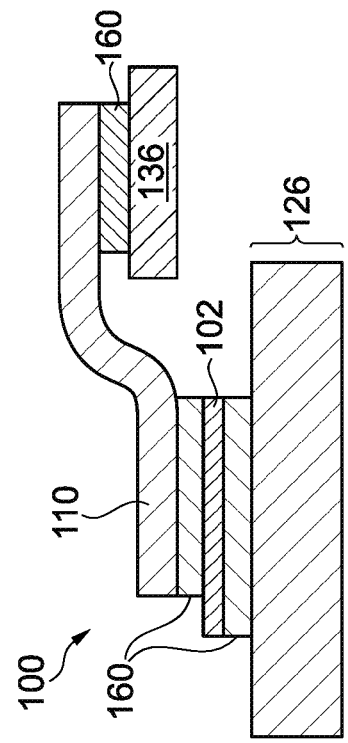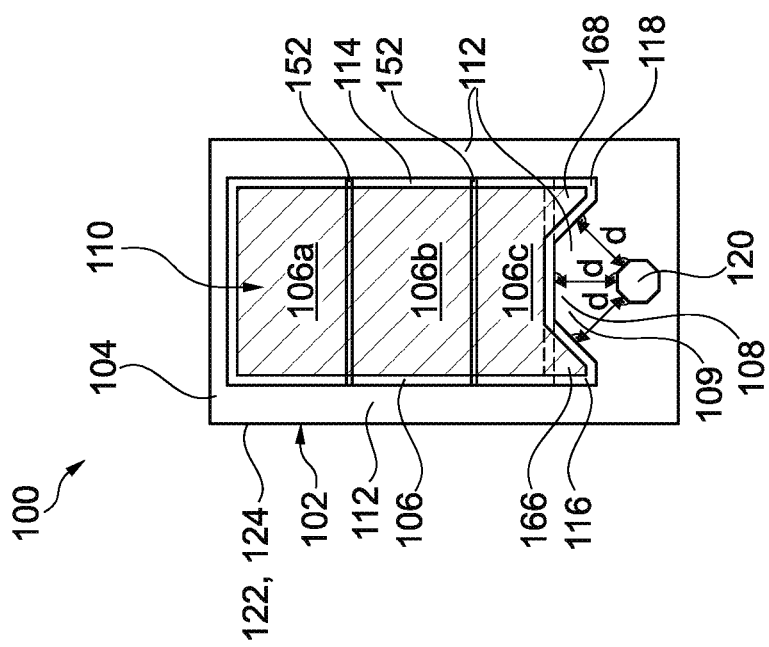

PACKAGE WITH PAD HAVING OPEN NOTCH

CROSS-REFERENCE TO RELATED APPLICATION

This Utility patent application claims priority to German Patent Application No. 10 2020 125 371.0, filed Sep. 29, 2020, which is incorporated herein by reference.

BACKGROUND

Various embodiments relate generally to packages and methods of manufacturing a package.

Packages may be denoted as usually encapsulated electronic components with electrical connects extending out of the encapsulant. For example, packages may be connected to an electronic periphery, for instance mounted on a printed circuit board, or mounted onto a heatsink and connected via connectors to a larger system.

Packaging cost is an important driver for the industry. Related with this are performance, dimensions and reliability. The different packaging solutions are manifold and have to address the needs of a specific application.

In particular packages with power semiconductor chips may generate a considerable amount of heat during operation. This may limit reliability and performance.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 illustrates a plan view of a preform of a package according to an exemplary embodiment.

FIG. 2 illustrates a plan view of a package according to FIG. 1 after mounting a spacer body.

FIG. 3 illustrates a plan view of a package after mounting a spacer body according to another exemplary embodiment.

FIG. 4 illustrates a plan view of a preform of a package according to any of FIG. 1 to FIG. 3 showing an active area of an electronic component of the package.

FIG. 5 illustrates a three-dimensional view of a package with an electronic component and a spacer body between a bottom substrate and a top substrate according to another exemplary embodiment.

FIG. 6 illustrates a cross-sectional view of a package with a clip-type spacer body according to another exemplary embodiment.

FIG. 7 illustrates a plan view of a package according to another exemplary embodiment.

FIG. 8 illustrates a cross-sectional view of a package according to still another exemplary embodiment.

FIG. 9 illustrates a cross-sectional view of a package according to yet another exemplary embodiment.

DETAILED DESCRIPTION

Figure 12:
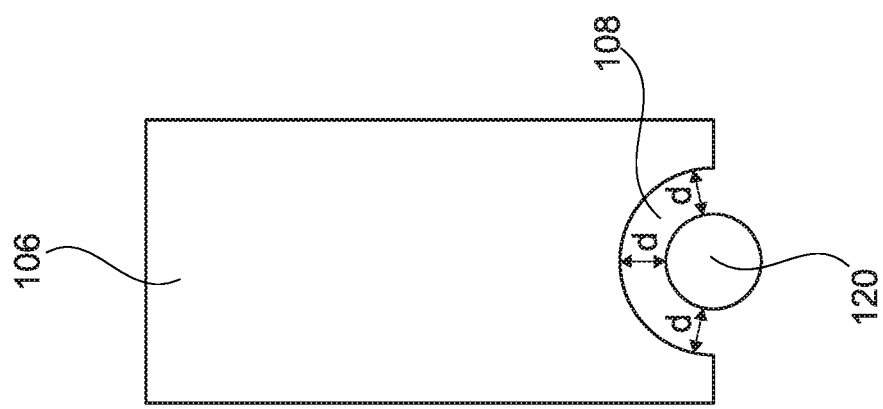
FIG. 10 to FIG. 12 shows different configurations of source pads and gate pads with substantially equidistant spacing along an open notch of the source pad according to exemplary embodiments.

There may be a need for a package with proper reliability and performance.

According to an exemplary embodiment of a first aspect of the disclosure, a package is provided which comprises an electronic component having a first main surface with an electrically conductive first pad, the first pad having an open notch, and a spacer body mounted on the first pad and bridging at least part of the open notch.

According to another exemplary embodiment of the first aspect of the disclosure, a method of manufacturing a package is provided, wherein the method comprises providing an electronic component having a first main surface with an electrically conductive first pad, the first pad having an open notch, and mounting a spacer body on the first pad so that the spacer body bridges at least part of the open notch.

According to an exemplary embodiment of a second aspect of the disclosure, a package is provided which comprises an electronic component having a first main surface with an electrically conductive first pad, the first pad having an open notch, and a spacer body having a further open notch and being mounted on the first pad so that the open notch of the first pad overlaps partially or entirely (in particular is aligned) with the open notch of the spacer body.

According to another exemplary embodiment of the second aspect of the disclosure, a method of manufacturing a package is provided, wherein the method comprises providing an electronic component having a first main surface with an electrically conductive first pad, the first pad having an open notch, and mounting a spacer body having a further open notch on the first pad so that the open notch of the first pad overlaps at least partially with the open notch of the spacer body.

According to an exemplary embodiment of a third aspect of the disclosure, a package is provided which comprises an electronic component with an electrically conductive first pad having an open notch and with an electrically conductive second pad, wherein the second pad is arranged so as to be substantially equidistantly spaced from the first pad along the open notch (in particular along an entire edge of the first pad delimiting the open notch).

According to another exemplary embodiment of the third aspect of the disclosure, a method of manufacturing a package is provided, wherein the method comprises providing an electronic component with an electrically conductive first pad having an open notch and with an electrically conductive second pad, and arranging the second pad so as to be substantially equidistantly spaced from the first pad along the open notch.

According to an exemplary embodiment of the first aspect, a package is provided in which a spacer for electrically and/or thermally connecting an electronic component within a package is arranged to bridge a notch of an assigned pad on which the spacer is mounted. As a result, a spatial coverage of the pad by the spacer may be increased, which may also enhance the electric and/or thermal coupling of the electronic component. At the same time, the pad of the electronic component may be advantageously provided with said open notch which may efficiently prevent assembly and/or stress related shorts between different pads of the electronic component by interconnect material (such as a solder) used for connecting the electronic component within the package, in particular with the spacer. Hence, the demand of a very precise assembly process may be relaxed. Simultaneously, the electric and/or thermal coupling properties of the electronic component may be improved, since the bridging configuration of the spacer may combine a large spacer surface with a simple spacer geometry.

According to an exemplary embodiment of the second aspect, a package is provided in which a pad of an electronic component and an assigned spacer may be both provided with at least partially mutually matching open notch geometry. In other words, open notches of spacer and pad may be aligned (in particular without bridging the pad notch by the spacer). Such an open notch geometry of both pad and spacer may reliably avoid undesired electric shorts between different pads of the electronic component by interconnect material. By configuring the spacer with an adapted open notch geometry which may follow the open notch geometry of the pad, the electric and/or thermal coupling surface between pad and spacer may be increased while simultaneously keeping the spacer small and consequently the package lightweight and compact.

According to an exemplary embodiment of the third aspect, a package is provided in which an open notch of a first pad as well as a position and shape of a second pad are adjusted or balanced so as to ensure an almost constant distance between the first pad and the second pad along an extension of the open notch of the first pad. Such a substantially equidistant design rule may significantly suppress the risk of undesired electric shorts between said first and second pads of the electronic component by interconnect material connecting the first pad with a spacer and may thereby enhance the electric and/or thermal reliability of the package.

DESCRIPTION OF FURTHER EXEMPLARY EMBODIMENTS

In the following, further exemplary embodiments of the packages and the methods will be explained.

In the context of the present application, the term "package" may particularly denote an electronic device which may comprise one or more electronic components being for instance mounted on a carrier, said carrier to comprise or consist out of a single part, multiple parts joined via encapsulation or other package components, or a subassembly of carriers. Said constituents of the package may be optionally encapsulated at least partially by an encapsulant.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed for example in silicon technology, gallium nitride technology, silicon carbide technology, etc.

In the context of the present application, the term "spacer body" may in particular denote an electrically and/or thermally conductive body configured for vertically spacing a pad of an electronic component with respect to a substrate or an exterior main surface of the package while promoting the electric and/or the thermal coupling of the electronic component within the package. In one embodiment, electric current or electric signals may flow between the spacer-connected pad of the electronic component and the spacer. Additionally or alternatively, heat created by the electronic component during operation of the package may be thermally conducted by the spacer body away from the electronic component and out of the package. It is also possible that the spacer provides an electric clip function, i.e. serves as an electric connection element electrically connecting the electronic component with another electrically conductive body of the package, such as an electrically conductive carrier (for instance a leadframe or a direct copper bonding (DCB) substrate).

In the context of the present application, the term "open notch" may in particular denote an indentation or a depression extending into the first pad or the spacer body, respectively, and being open or exposed towards an environment of the first pad or the spacer body. In particular, such an open notch-type recess may be delimited by a continuous edge line or edge area of the first pad or the spacer body and may be opened towards a surrounding of the first pad or the spacer body, respectively. For example, the first pad may comprise different sections partially delimiting the notch from different sides. Said different sections may be mutually spaced or integrally connected in an electrically conductive way so as to form an equipotential surface. For instance, the notch may be unclosed at the open side and another pad (in particular a gate pad) may be arranged adjacent to the open notch of the first mentioned pad (in particular a source pad).

In the context of the present application, the term "spacer body bridging at least part of the open notch of the first pad of the electronic component" may in particular denote that the spacer body covers or overlaps the open notch of the first pad of the electronic component without direct physical contact between the spacer body and a bottom surface of the electronic component in the bridging region.

In the context of the present application, the term "open notch of the first pad overlaps at least partially with the open notch of the spacer body" may in particular denote that the open notch of the spacer body may extend partially or entirely over the spatial range defined by the open notch of the first pad. In one embodiment, no spacer material may be visible in a plan view in the spatial range defined by the entire open notch of the first pad of the electronic component. In another embodiment, no spacer material may be visible in a plan view in a sub-portion of the spatial range defined by the open notch of the first pad of the electronic component, whereas spacer material may be visible in the plan view in another sub-portion of the spatial range defined by the open notch of the first pad.

In the context of the present application, the term "second pad arranged so as to be substantially equidistantly spaced from the first pad along the open notch" may in particular denote that shortest distances between edges delimiting the first pad and the second pad may be exactly or at least essentially identical along the extension of the open notch of the first pad. For example, said individual distances may differ from an average distance value (i.e. averaged over the extension of the open notch of the first pad) by not more than ±20%, in particular by not more than ±10%, preferably by not more than ±5%.

A gist of exemplary embodiments may be to provide a package using one or more spacers for a special chip design to connect a chip-type electronic component within the package, in particular with a top substrate of the package. In an embodiment, a spacer with a different shape (for instance a rectangular shape) than a shape of the source pad (for instance a substantially rectangular shape with an open notch) of the electronic component may be implemented. As a result, the spacer can bridge one or more dielectric (for instance polyimide) areas on the electronic component. Synergistically, such an embodiment may be combined with another embodiment in which an electronic component is provided which has a source pad with said open notch (for example a V-shaped or trapezoidal groove) adjacent to a (for instance polygonal) gate pad. In such a configuration, the distance source-to-gate may be adjusted to be substantially or entirely identical along the pad edge delimiting the notch. This may advantageously render undesired shorts between source and gate unlikely and may thereby improve the electric reliability of the package. Additionally or alternatively to the bridging configuration of the spacer versus the source pad, the spacer may also be provided with an open notch for increasing the compactness of the package.

In an embodiment, the spacer body may extend or protrude beyond the first pad at one or more edges of the first pad, additionally or alternatively to the lateral protrusion of the spacer over the open notch of the first pad. Such an oversizing of the spacer may further improve the thermal performance of the package.

In an embodiment, the first main surface has an electrically insulating region at or in the open notch. The electrically insulating region may also surround the first pad (and a second pad, if present, on the same main surface of the electronic component). This may improve the reliability of a dielectric decoupling between the first pad and a second pad of the electronic component.

In an embodiment, the spacer body bridges the open notch without physical contact with the electrically insulating region. Also by avoiding direct contact between spacer body and the electrically insulating region, the formation of undesired electrically conductive paths in the package may be prevented.

In an embodiment, the spacer body is thermally conductive and/or electrically conductive. For instance, the spacer body may have a thermal conductivity of at least 50 W/mK. When made of a thermally conductive material, the spacer body may significantly contribute to the removal of heat created by the electronic component out of the package. When made of an electrically conductive material, electric current and/or electric signals may be conducted between electronic component and spacer body. Preferably, the spacer body has a heat removal function and an electric function in the framework of the overall functionality of the package.

In an embodiment, the spacer body is mounted in a thermally conductive and/or electrically conductive manner on the first pad of the electronic component. In particular, heat and/or current may be conducted between the spacer body and an active semiconductor region of the electronic component by the first pad.

In an embodiment, the spacer body is mounted on the first pad by one of the group consisting of soldering (in particular diffusion soldering), sintering, welding and adhering (in particular using an electrically conductive glue). Other connection techniques may be implemented as well.

In an embodiment, the first pad and a mounting surface of the spacer body have different geometrical shapes. This increases the freedom of design when configuring the package for a specific application.

In another embodiment, the first pad and a mounting surface of the spacer body have identical geometrical shapes, in particular the same outline. By forming the first pad and the mounting surface with accordingly shaped outlines, the conduction of heat and electricity between spacer body and first pad may be precisely matched or adjusted. Weight and dimensions of the package may be kept small by keeping the spacer body sufficiently small.

In an embodiment, the first pad has a rectangular section (in particular integrally) connected with a first extension section (such as a tapering section) and a second extension section (such as a further tapering section), the extension sections being mutually spaced by the open notch. The rectangular section may be a single integral structure or may be composed of a plurality of connected or unconnected individual substructures. The provision of two opposing extension sections may contribute to the definition of the open notch and may thereby support an advantageous mutual arrangement of different pads with substantially equal distance along the extension of the open notch.

In an embodiment, a mounting surface of the spacer body is rectangular. This may allow to manufacture the spacer body with low effort, for instance as a cuboid metal block.

In an embodiment, the spacer body is mounted on each of at least part of the (in particular substantially the entire) rectangular section, at least part of the (in particular substantially the entire) first extension section and at least part of the (in particular substantially the entire) second extension section. As a result, a highly intense thermal and/or electric coupling between spacer body and electronic component may be established. This may strongly suppress the formation of hotspots and may thereby improve reliability and performance of the package.

In an embodiment, the open notch is shaped in accordance with at least one of the group consisting of rounded (for instance semi-circular), trapezoid-shaped (in particular based on a trapezoid tapering inwardly and being preferably formed as a symmetrical or regular trapezoid), substantially V-shaped, substantially U-shaped, and rectangular shaped. Other shapes of the open notch of the first pad are possible.

In an embodiment, the electronic component has an electrically conductive second pad on the first main surface. The first pad and the second pad may be coplanar and electrically decoupled from each other.

In an embodiment, the second pad is arranged next to the open notch. In particular, the second pad may be located outside of the open notch but facing the latter. With such a geometry, a compact configuration with nevertheless reliable dielectric decoupling between first and second pad may be achieved. In particular, a minimum distance between first pad and second pad may be less than 3 mm, in particular less than 1.5 mm. For instance, the minimum distance between first pad and second pad may be at least 300 µm, in particular at least 600 µm.

In an embodiment, the second pad is arranged so as to be substantially equidistantly spaced from the first pad along the entire open notch. Highly advantageously, this may avoid excessively small distances between first and second pad. By equidistantly spacing first and second pad from each other with a substantially constant distance between opposing edges of the first and second pads, it may be guaranteed that connection medium (such as solder or adhesive) connecting the spacer body with the first pad does not unintentionally flow up to the second pad. Consequently, an undesired short-circuiting between the pads may be suppressed.

In an embodiment, the second pad is shaped in accordance with at least one of the group consisting of a circular shape, and a polygonal shape, in particular a rectangular shape, a hexagon shape, and an octagon shape. Other shapes are however possible.

In an embodiment, the spacer body does not extend across the second pad. This ensures that a reliable electric isolation between first pad and second pad is not compromised by the spacer body.

In an embodiment, the electronic component has an electrically conductive third pad on a second main surface opposing the first main surface. Also the third pad may contribute to heat removal and/or electric signal or power transport in the package. Preferably, the third pad covers substantially the entire second main surface.

In an embodiment, the electronic component is a semiconductor power chip. In particular for semiconductor power applications, an efficient heat removal and a high current carrying capability as well as a high performance and high reliability are of utmost advantage. The above-described configuration of first and second pads as well as of the spacer body thus provide a significant improvement of semiconductor power packages.

In an embodiment, the electronic component is configured for experiencing a vertical current flow during operation. In particular, electric current may flow between a pad on a lower main surface of the electronic component through semiconductor material of the electronic component to another pad at an upper main surface of the electronic component.

In an embodiment, the electronic component is a transistor chip. Hence, the electronic component may provide a transistor function, in particular may operate as a field effect transistor or as a bipolar transistor. However, the electronic component may also provide another electronic functionality, for instance a diode functionality.

In an embodiment, said first main surface of the electronic component may have a first pad configured as a source pad and may have a second pad configured as a gate pad. The opposing other main surface of the electronic component may have a third pad configured as a drain pad.

In an embodiment, the package comprises a bottom substrate on which the electronic component is mounted. In the context of the present application, the term "bottom substrate" or "carrier" may particularly denote a support structure (preferably, but not necessarily electrically conductive) which serves as a mechanical support for the one or more electronic components, and which may also contribute to the electric interconnection between the electronic component(s) and the periphery of the package. In other words, the bottom substrate or carrier may fulfil a mechanical support function and an electric connection function. A bottom substrate or carrier may comprise or consist of a single part, multiple parts joined via encapsulation or other package components, or a subassembly of carriers.

In an embodiment, the package comprises a top substrate mounted on the spacer body. The top substrate may contribute to a cooling of the electronic component during operation of the package.

In an embodiment, at least one of the bottom substrate and the top substrate comprises a thermally conductive and electrically insulating sheet covered on both opposing main surfaces thereof with a respective electrically conductive layer. Hence, any of the substrates may comprise a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). For instance, such a stack-type substrate may be a direct copper bonding (DCB) substrate, and a direct aluminium bonding (DAB) substrate. However, each substrate may also be configured as Active Metal Brazing (AMB) substrate, or as patterned metal plate (for example a leadframe).

The provision of both a thermally highly conductive bottom substrate and a thermally highly conductive top substrate may allow to establish a double-sided cooling architecture.

In an embodiment, the package comprises an electrically conductive connection body (for example a lead of a leadframe) which is electrically coupled with the first pad by the spacer body being configured as an electrically conductive clip. Hence, the spacer body may synergistically also function as a clip. Such a clip-type spacer body may in particular be configured for electrically coupling a pad of the electronic component with an electrically conductive connection body located at another vertical level than the pad.

In an embodiment, the package comprises an encapsulant encapsulating at least part of the electronic component and at least part of the spacer body. For example, such an encapsulant may be a mold compound or a soft encapsulant. In the context of the present application, the term "encapsulant" may particularly denote a substantially electrically insulating and preferably thermally conductive material surrounding at least part of an electronic component and at least part of the spacer body to provide mechanical protection, electrical insulation, and optionally a contribution to heat removal during operation.

In an embodiment, a mounting surface of the spacer body is larger than an area of the first pad. Such an oversizing of the spacer body may enhance the capability of the spacer body to carry heat (and electricity) and may advantageously contribute to the suppression of hotspots.

In an embodiment, the second pad is shaped in accordance with at least one of the group consisting of rounded, in particular circular, and cornered, in particular hexagonal or octagonal, shape. While other geometries of the second pad are possible, it may be advantageous to adjust the outlines of the first and second pads to achieve a constant spacing in between for reliably maintaining a dielectric decoupling between the pads.

In an embodiment, the first pad is formed as a rectangular metal layer with the open notch extending into one side, in particular into a short side, of the rectangular metal layer. Such a pad geometry is particularly advantageous for achieving a proper electric reliability.

In an embodiment, an exterior surface of the first pad and of the second pad are made of the same material. This may enable different possibilities for pad interconnection, for instance by soldering or wire bonding. The second pad may be in particular electrically contacted by one of a solder structure, a bond wire, and a clip.

In an embodiment, the package comprises a plurality of electronic components. Thus, the package may comprise one or more electronic components (for instance at least one passive component, such as a capacitor, and at least one active component, such as a semiconductor chip).

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the package is configured as power converter, in particular one of an AC/DC power converter and a DC/DC power converter. However, also other electronic applications, such as inverters, etc. may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Conventionally, a spacer may be mounted on top of a front side of a semiconductor chip. In such a conventional design, the semiconductor chip may be provided with a rectangular source pad. The spacer geometry may match the rectangular shape in such a conventional design. The spacer may be soldered on the source pad of said semiconductor chip so that the rectangular spacer matches the shape of the pad.

However, such a conventional design may impose the risk of assembly or stress related shorts between a gate pad and the source pad, if interconnect material, for instance solder paste, unintentionally contacts the gate pad. A very precise assembly process is thus required conventionally for ensuring tight spacings between gate and source. In order to relax the assembly design rules, the spacing between the neighboring pads must be increased. This may conventionally limit the compactness of the package.

According to an exemplary embodiment, a spacer (which may be configured as a clip in an embodiment) may bridge one or more electrically insulating (for example imide) areas on the front side of the electronic component. As a result, it may be dispensable to provide spacers necessarily with a shape being the same as a shape of the source pad, and vice versa. This provides a higher degree of freedom to a frontend designer regarding the chip layout. In particular, a spacer may be provided which bridges electrically insulating areas on the chip and only connects to a metallized pad area. In particular, such a configuration may ensure that heat can be transferred from the chip-type electronic component into the top part of the package or module in a highly efficient way. Advantageously, local hot spots can be reduced or even avoided. Consequently, the package or module can be operated under higher current conditions if the heat dissipation is better so that an improved performance may be achieved. Productive yield loss resulting from unconnected front side segments or spacer misalignment can be reduced.

Advantageously, a chip design of the electronic component comprising a source pad with an open notch and a gate pad being substantially equidistantly spaced with respect to the source pad in the region of the open notch may allow clip bonding without the need for highest accuracy pick and place tools. Such a chip design may also increase or even maximize the ratio of active area to total area. Moreover, the chip-type electronic component may be designed to allow different methods for gate bonding. In particular, thin wire gate bonding may become a feasible option.

More specifically, an exemplary embodiment may enable a connection of a front side of a chip-type electronic component to a spacer body in applications with for instance double sided cooled packages or modules. Such a package with double sided cooling may comprise a stack of electronic component and spacer between a bottom-sided first carrier (in particular a direct copper bonding (DCB) substrate) and a top-sided second carrier (in particular a further direct copper bonding (DCB) substrate). This may ensure an improved heat transfer from active areas on the semiconductor chip-type electronic component in particular into the top side of the package through the spacer.

According to exemplary embodiments, the shape of the front side metallization of the semiconductor chip does not necessarily have to match the shape of the spacer so that a high degree of freedom for the chip design may be achieved. Furthermore, a stable production yield with spacer soldering may be established.

Especially when employing silicon carbide (SiC) chips, significant benefits may be achieved by exemplary embodiments. Silicon carbide chips may be comparably small (for instance may have a surface area of less than 30 mm$^2$), so that it may be highly advantageous that such semiconductor chips are covered by active areas as much as possible. In particular, SiC metal oxide semiconductor field effect transistors (MOSFETs) may be advantageously manufactured according to exemplary embodiments. Further advantageously, an additional space can be given for gate contacts of the electronic component. Contrary to a conventional spacer design, exemplary embodiments may avoid local hot spots, which may advantageously result in an increased power output and/or decreased losses. At the same time, exemplary embodiments do not impair a manufacturability concept and relevant parameters (such as manufactured units per hour and yield). Moreover, exemplary embodiments are compatible with the connection of electronic components by one or more clips. Furthermore, a package with improved reliability and/or power output may be obtained. Beyond this, a reduced research and development effort may be achieved in view of a higher degree of freedom for the chip layout. Further advantageously, the described configuration may enable to obtain a favorable ratio of active area to total area, so that packages may be manufactured which use smaller semiconductor chips than in conventional designs.

In an embodiment, an open notch of the source pad may be formed in a short side of a substantially rectangular pad. Advantageously, such a design is symmetric along the long side of the substantially, but not completely rectangular pad design. This may ensure a proper thermal and electrical reliability and a high performance of the package.

FIG. 1 illustrates a plan view of a preform of a package 100 according to an exemplary embodiment. FIG. 2 illustrates a plan view of a package 100 according to FIG. 1 after mounting a spacer body 110.

The package 100 of FIG. 2 comprises an electronic component 102 which may be advantageously embodied as a semiconductor chip, for instance manufactured in silicon or silicon carbide technology. The electronic component 102 may be a transistor chip, more specifically a MOSFET chip. Additionally or alternatively, electronic component 102 may have a different electronic functionality, for instance may be embodied as insulated gate bipolar transistor (IGBT), diode, etc.

FIG. 1 and FIG. 2 show an upper first main surface 104 of the electronic component 102 with an electrically conductive first pad 106 with an open notch 108. The first pad 106 is here embodied as source pad. Moreover, the first main surface 104 has an electrically insulating region 112 at the open notch 108 and surrounding the first pad 106. More specifically and as shown in FIG. 1, the first pad 106 may be composed of multiple (in the shown embodiment three) pad sections 106a, 106b, 106c. Adjacent pad sections 106a/106b, 106b/106c may be optionally separated by a respective dielectric web 152 of an electrically insulating surface 150 of the electrically insulating region 112 (for instance made of polyimide). The dielectric webs 152 may vertically protrude beyond, may be vertically in flush with our may even be retracted vertically with respect to the pad sections 106a, 106b, 106c. As shown, the pad sections 106a, 106b may be rectangular, whereas pad section 106c of the first pad 106 may have the open notch 108 at a side facing away from the pad sections 106a, 106b. Said open notch 108 is here embodied as a trapezoidal recess in pad section 106c facing towards a second pad 120 formed on the same first main surface 104 of the electronic component 102. Preferably, an exterior surface of the first pad 106 and of the second pad 120 are made of the same material. The second pad 120 is here configured as gate pad of electronic component 102. More specifically, open notch 108 is delimited by a continuous edge line of the first pad 106 and is opened towards a surrounding of the first pad 106 and towards the second pad 120.

As shown in FIG. 2, a spacer body 110 is mounted on the first pad 106. Preferably, spacer body 110 is electrically and thermally conductive and should be made of a material being connectable to the first pad 106. For example, spacer body 110 may be made of copper, aluminum, AlSiC, or any electrically and thermally conductive composite material. Advantageously, the material of the spacer body 110 is solderable. Preferably, spacer body 110 is soldered on the first pad 106 (for instance by diffusion soldering). Alternatively, connection of the spacer body 110 with the first pad 106 of the electronic component 102 may be accomplished by sintering, welding or gluing (preferably using an electrically conductive adhesive). During operation of the package 100, electric current may be conducted between first pad 106 and spacer body 110. Furthermore, heat generated by the electronic component 102 during operation may be removed out of the package 100 via spacer body 110.

In the configuration of FIG. 2, the spacer body 110 may be embodied as a cuboid block with a rectangular ground surface connected to the first pad 106 of the electronic component 102. As shown in FIG. 2 as well, the rectangular ground surface of the spacer body 110 is mounted on the first pad 106 so as to bridge part of the open notch 108. More specifically, the ground surface of the spacer body 110 is soldered directly on a major portion of the first pad 106 and also covers or spans a major portion of open notch 108 of the first pad 106. Thereby, a portion (more specifically a lower portion according to FIG. 2) of the ground surface of the spacer body 110 is electrically and thermally coupled with extension sections 116, 118 of the first pad 106 between which the open notch 108 is formed. A bottom of the open notch 108 is delimited by dielectric material of the electrically insulating surface 150 of the electronic component 102. No direct physical contact is established between the ground surface of the spacer body 110 and the electrically insulating surface 150 in the region of the open notch 108. Thus, the spacer body 110 bridges the open notch 108 without physical contact with the electrically insulating region 112. In addition to the bridging of the open notch 108, the spacer body 110 is mounted on substantially an entire rectangular section 114, almost the entire first extension section 116 and almost the entire second extension section 118 of the first pad 106 to thereby ensure a highly efficient electric and thermal coupling between the electronic component 102 and the spacer body 110. Consequently, a rectangular mounting surface of the spacer body 110 is larger than an area of the first pad 106. By said bridging which indirectly ensures a sufficiently large contact area between spacer body 110 and first pad 106, the described notch-design of the first pad 106 may be realized without a pronounced establishment of hotspots. As shown in FIG. 2 with reference sign 154, a moderate formation of hotspots may occur below the extension sections 116, 118 of the first pad 106. However, such hotspots 154 may be not very pronounced, since the thermally conductive spacer body 110 contacts with its rectangular ground surface also major portions of the extension sections 116, 118. Thus, the formation of strongly heated portions may be avoided even without the need of deviating from a simple cuboid geometry of the spacer body 110. Hence, spacer body 110 of FIG. 2 can be manufactured in a simple way and may nevertheless ensure proper heat removal from the electronic component 102 during operation of the package 100. This may be promoted by manufacturing the first pad 106 and a mounting surface of the spacer body 110 with different geometrical shapes.

As best seen in FIG. 1, the first pad 106 has rectangular section 114 (composed of the entire pad sections 106a, 106b and a part of pad section 106c) connected with first extension section 116 and second extension section 118 (both constituted by another part of pad section 106c). As shown, the extension sections 116, 118 are mutually spaced by the open notch 108. The open notch 108 of the first pad 106 is delimited by facing edges of the extension sections 116, 118 as well as by a horizontal edge of pad section 106c. According to FIG. 1 and FIG. 2, said facing edges of the extension sections 116, 118 are straight and slanted, whereas said additional notch delimiting edge of pad section 106c is arranged horizontally. In view of this configuration, the open notch 108 is trapezoid-shaped in the illustrated embodiment.

As already mentioned above, the electronic component 102 has additionally electrically conductive second pad 120 on the first main surface 104. As shown, the second pad 120 is arranged next to the open notch 108. More specifically and highly advantageously, the second pad 120 is arranged so as to be substantially equidistantly spaced from the first pad 106 along the entire extension of the open notch 108. In other words, a distance, d, between the first pad 106 and the second pad 120 is exactly or almost the same along the notch-related facing portions of the first pad 106 and the second pad 120. In other words, the distance source-to-gate is the same for any position. For example, said distance, d, may be in the range from 100 µm to 3 mm, in particular in the range from 500 µm to 2 mm, for example 900 µm. Such distances, d, may reliably prevent solder material (which may temporarily become flowable for contacting first gate pad 106 with spacer body 110) from flowing up to the second pad 120. Therefore, the formation of undesired electrically conductive paths may be reliably prevented. A resulting reliable electric isolation between source pad 106 and gate pad 120 is of utmost advantage for high current applications.

In order to ensure said substantially equidistant spacing between first pad 106 and second pad 120 in the region of the open notch 108, the second pad 120 is provided with an octagon shape. In the region of the open notch 108, both the open notch 108 and the second pad 120 are delimited by three straight and angled sections (108a, 108b, 108c, and 120a, 120b, 120c), wherein corresponding pairs (108a and 120a, 108b and 120b, and 108c and 120c) of sections of the open notch 108 and the second pad 120 are parallel to each other. Such a substantially equidistant design rule may significantly suppress the risk of undesired electric shorts between the first pad 106 and the second pad 120 of the electronic component 102 by solder material connecting the first pad 106 with the spacer body 110. This may improve the electric reliability of the package 100. By the bridging arrangement of the spacer body 110 as illustrated by reference sign 156 in FIG. 2, the formation of hotspots 154 resulting from the shown chip design may be synergistically suppressed so that also a proper thermal reliability and performance may be obtained.

As shown in FIG. 2, the spacer body 110 does not extend up to and across the second pad 120 and thereby keeps the second pad 120 free for an electric connection, for instance using a bond wire (not shown).

Although only indicated schematically in FIG. 1 and FIG. 2, the electronic component 102 may have an electrically conductive third pad (see reference sign 122 in FIG. 6) on a second main surface (see reference sign 124 in FIG. 6) of the electronic component 102 opposing the first main surface 104. Said third pad may be configured as drain pad of the transistor chip-type electronic component 102. The electronic component 102 may thus be configured as a semiconductor power chip with MOSFET functionality. Advantageously, the MOSFET-type electronic component 102 is configured for experiencing a vertical current flow during operation, i.e. through semiconductor material of the electronic component 102 in a direction perpendicular to the paper plane of FIG. 1 and FIG. 2.

Hence, the embodiment shown in FIG. 1 as FIG. 2 provides an oversized spacer body 110 for promoting the thermal performance with a simple spacer design. This allows to connect almost the entire source pad 106 with its trapezoidal (or V-shaped) open notch 108 to the spacer body 110 while realizing a simple rectangular shape of the spacer body 110. The open notch design of the first pad 106 of the electronic component 102 is perfectly compatible with the cuboid design of the spacer body 110. The imide area of the electrically insulating region 112 in the open notch 108 can be bridged (and will thereby not be affected) by the spacer body 110. This oversized design of the spacer body 110 may efficiently reduce the hotspot area, i.e. the area according to reference sign 154, without direct connection to the spacer body 110. Such a reduction of the hotspot area may be for example approximately 50%. As a result of the described design of the first pad 106 and the spacer body 110, heat can be transferred efficiently into the top part of the module or package 100 in an upward direction perpendicular to the paper plane of FIG. 2. Further advantageously, the technical implementation of the described embodiment does not involve a significant complexity in the manufacturing architecture. While the oversized spacer body 110 may also be soldered to the extension sections 116, 118, the spacer body 110 may locally bridge imide material of the electrically insulated region 112 (i.e. may be not soldered here). The enlarged contact area between spacer body 110 and first pad 106 may dissipate more heat and may therefore allow a higher output current. A proper match is achieved between the illustrated chip design with substantially constant gate-source distance (d) and the oversized and bridging spacer design. As a further advantage, the implementation of an oversized spacer body 110 may even show improved positioning during soldering. When manufacturing packages 100 according to FIG. 2, an increased yield can be achieved.

For example, cuboid spacer body 110 may be provided with spatial dimensions of 5.1 mm×3.0 mm×1.0 mm. Such a spacer body 110 may substantially fully cover the three segments or sections 106a, 106b, 106c of the source-type first pad 106. The spacer body 110 may be symmetrically positioned on the chip-type electronic component 102. The trapezoidal or V-shaped imide notch 108 close to the second pad 120 (configured as gate pad) can be partially or entirely bridged by the spacer body 110. In a plan view of package 100, oversized spacer body 110 may laterally protrude into open notch 108. A good yield can be achieved with such a package design.

FIG. 3 illustrates a plan view of a package 100 after mounting a spacer body 110 according to another exemplary embodiment.

The embodiment of FIG. 3 differs from the embodiment of FIG. 2 by a smaller dimension of the spacer body 110. Spacer body 110 with its rectangular bottom surface does not cover the extension sections 116, 118 of the first pad 106 according to FIG. 3. Consequently, the hotspots 154 are more pronounced according to FIG. 3 compared to FIG. 2. However, package 100 according to FIG. 3 can be manufactured more compact than the one according to FIG. 2 thanks to the smaller spacer body 110. If an operation with a moderate power or electric current is sufficient in an application, package 100 according to FIG. 3 may be a compact and lightweight choice.

As can be taken from FIG. 3 as well, this embodiment can also implement, as electronic component 102, a silicon carbide chip with a substantially rectangular source pad 106 with open notch 108 in order to provide a constant distance, d, between the source pad 106 and the gate pad 120 along the open notch 108. This chip design may ensure that the spacing between the source pad 106 and the gate pad 120 is constant along the perimeter of the indented, notched or grooved part of the source pad 106. This may be realized by introducing cornered gate pad 120 (for instance with hexagonal or octagonal outline), or alternatively with round gate pad (not shown in FIG. 3). The indentation within the source pad 106 allows to resemble the same geometry, thus keeping the distance, d, constant.

FIG. 4 illustrates a plan view of a preform of package 100 according to FIG. 3 and in particular shows an active area 158 of the electronic component 102 of the package 100. Configuring the gate pad 120 with the illustrated shape may reduce losses of active area 158 of the electronic component 102, as an area below the gate pad 120 may relate to a non-active area, i.e. may be arranged outside of the active area 158. In contrast to this, the source pad 106 may be formed on the active area 158. The active area 158 of the electronic component 102 may correspond to a region of the semiconductor body being processed for forming the one or more integrated circuit elements of the electronic component 102. Descriptively speaking, active area 158 represents the region of the electronic component 102 becoming hot during operation of the package 100.

More generally, the metallization of the gate pad 120 may be of the same finish as the source pad 106. This may enable different possibilities for the gate interconnect: the gate pad 120 can be soldered as well as ball bond wire bonded. By employing a round or a nearly round (for instance octagonal) shape for the gate pad 120, solder balls may even be placed on the gate pad 120 on wafer level. In this case, the gate pad 120 may be connected as well to a clip (not shown).

Again referring to FIG. 3, the implemented spacer body 110 does not cover the open notch 108 of the source pad 106. Consequently, a significant portion of the active area 158 of the chip-type electronic component 102 is not directly coupled with the spacer body 110 (compare FIG. 3 with FIG. 4). Hence, hotspots 154 may be more pronounced according to FIG. 3 as compared with the embodiment of FIG. 2. However, local overheating can be avoided by implementing the oversized spacer configuration of FIG. 2 and/or by reducing the power output of the module or package 100 of FIG. 3 which might be sufficient for certain applications.

Concluding, the embodiment of FIG. 2 may be preferred when a high thermal performance and a high power output is desired. The embodiment of FIG. 3 may be preferred when a compact and lightweight configuration is desired. Both embodiments offer a reliable protection against an undesired flow of solder to the gate pad 120 when connecting the source pad 106 with the spacer body 110.

FIG. 5 illustrates a three-dimensional view of a package 100 with an electronic component 102 and a spacer body 110 between a bottom substrate 126 and a top substrate 128 according to another exemplary embodiment. As can be taken from FIG. 5, the configuration of the spacer body 110, the first pad 106 and the second pad 120 may be similar as in FIG. 2. However, it is alternatively also possible that the relationship between spacer body 110 and first pad 106 according to FIG. 3 is implemented in the embodiment of FIG. 5.

As shown in FIG. 5, the package 100 comprises bottom substrate 126 on which the electronic component 102 is mounted. Furthermore, package 100 comprises top substrate 128 mounted on the spacer body 110. Each of the bottom substrate 126 and the top substrate 128 may comprises a central thermally conductive and electrically insulating sheet 130 (in particular a ceramic plate) covered on both opposing main surfaces thereof with a respective electrically conductive layer 132, 134 (for example a patterned or continuous copper layer). Hence, each of substrates 126, 128 may be a direct copper bonding (DCB) substrate. Alternatively, any of substrates 126, 128 may be embodied as direct aluminum bonding (DAB) substrate, Active Metal Brazing (AMB) substrate, or patterned metal plate (for example leadframe).

As illustrated by reference sign 160 in FIG. 5, any of the connections between bottom substrate 126 and electronic component 102, between electronic component 102 and spacer body 110, and between spacer body 110 and top substrate 128 may be a solder connection.

As shown schematically in FIG. 5, package 100 may comprise an encapsulant 138 encapsulating at least part of the electronic component 102 and at least part of the spacer body 110. Also one or both of the substrates 126, 128 may be encapsulated by encapsulant 138. Preferably, encapsulant 138 is a mold compound. Alternatively, encapsulant 138 may be a soft potting compound. Optionally, the mold compound may be provided with functional particles, such as ceramic particles (for instance made of aluminum oxide, aluminum nitride, silicon oxide, etc.) for enhancing the thermal conductivity of the encapsulant 138.

The architecture illustrated in FIG. 5 provides a double sided cooled (DSC) module or package 100. Thus, heat created by the electronic component 102 during operation of the package 100 may be removed both in an upward direction via the top substrate 128 as well as in a downward direction via the bottom substrate 126 out of the package 100. In particular, the top side of spacer body 110 is connected to the bottom side of the top substrate 128. This enables a transfer of heat from the chip-type electronic component 102 also to the top side. By taking this measure, the thermal performance of the package 100 may be significantly improved in comparison with conventional concepts in which heat is only dissipated through the bottom side of the module. According to FIG. 5, spacer body 110 thermally and electrically connects the electronic component 102 to the top substrate 128. This may enable both a current and heat flow along the path electronic component 102-spacer body 110-top substrate 128.

For manufacturing the package 100 of FIG. 5 configured for double-sided cooling, solder paste may be printed on electronic components 102, for instance using stencils. A pick and place process may then handle the spacer bodies 110 on a solder reservoir. Different pick and place tools may be implemented for different spacer dimensions. A stack composed of bottom substrate 126, electronic component 102, spacer body 110 and top substrate 128 may then be interconnected by soldering.

FIG. 6 illustrates a cross-sectional view of a package 100 with a clip-type spacer body 110 according to another exemplary embodiment.

According to FIG. 6, drain pad 122 on the bottom side of the electronic component 102 is mounted on a leadframe-type bottom substrate 126, i.e. on a patterned metal plate. More specifically, the electronic component 102 may be mounted on a die pad of leadframe-type bottom substrate 126. Gate pad 120 on the opposing side of the electronic component 102 is electrically connected to a lead of the bottom substrate 126 by a bond wire 162. Source pad 106 on the same side of the electronic component 102 is coupled with spacer body 110. Source pad 106 may be configured with an open notch 108, for instance as shown in FIG. 2. The described configuration is encapsulated in an encapsulant 138, in particular a mold compound. However, an upper surface of the spacer body 110 is exposed with respect to the encapsulant 138 for rendering cooling even more efficient.

Furthermore, an electrically conductive connection body 136 is electrically coupled with the first pad 106 by the spacer body 110. Descriptively speaking, spacer body 110 therefore simultaneously functions as an electrically conductive clip. In the shown embodiment, electrically conductive connection body 136 is a lead of the leadframe-type bottom substrate 126.

FIG. 7 illustrates a plan view of a package 100 according to another exemplary embodiment.

The embodiment of FIG. 7 differs from the embodiment of FIG. 2 in particular concerning the configuration of the spacer body 110. While spacer body 110 has a rectangular mounting surface according to FIG. 2, spacer body 110 of FIG. 7 has an open notch 109 aligned with open notch 108 of first pad 106. As shown in FIG. 7, said spacer body 110 is mounted on the first pad 106 so that the open notch 108 of the first pad 106 overlaps with and is aligned with the open notch 109 of the spacer body 110. In other words, the outline of the first pad 106 substantially corresponds to the outline of the spacer body 110. Rather than bridging open notch 108, spacer body 110 of FIG. 7 covers substantially the entire first pad 106 and is free of extending over electrically insulating region 112. In others words, the first pad 106 and a mounting surface of the spacer body 110 have identical geometrical shapes. In particular, extension sections 166, 168 of the spacer body 110 between which open notch 109 is formed, overlay extension sections 116, 118 of first pad 106.

Descriptively speaking, the essentially rectangular geometry of the spacer body 110 with its open notch 109 mimics the essentially rectangular geometry of the source pad 106 with its open notch 108. This spacer configuration is thereby perfectly compatible with the configuration of the first pad 106 having open notch 108 in conjunction with second pad 120 being equidistantly spaced from the first pad 106 along the open notch 108. As the open notch 108, also open notch 109 is trapezoid-shaped according to FIG. 7.

As in FIG. 2 and FIG. 3, the first pad 106 of FIG. 7 is formed as a rectangular metal layer with its open notch 108 extending into a short side of the rectangular metal layer. Correspondingly, spacer body 110 of FIG. 7 is formed as a cuboid metal block with its open notch 109 extending into a short side of the cuboid metal block. In a plan view, open notches 108, 109 are mutually aligned.

FIG. 8 illustrates a cross-sectional view of a package 100 according to still another exemplary embodiment.

Similar as in FIG. 5, package 100 of FIG. 8 comprises a bottom-sided ceramic-based substrate 126 (such as a DCB or an AMB) on which the electronic component 102 (for instance a silicon, silicon carbide or gallium nitride semiconductor chip) is mounted. Correspondingly, package 100 of FIG. 8 comprises a top-sided ceramic-based substrate 128 (such as a DCB or an AMB) mounted on the spacer body 110.

As shown with reference sign 160, interconnection layers (for instance comprising diffusion solder, Ag/Cu sinter, adhesive glue) are arranged between substrate 126 and electronic component 102, between electronic component 102 and spacer body 110, and between spacer body 110 and substrate 128.

FIG. 9 illustrates a cross-sectional view of a package 100 according to yet another exemplary embodiment.

The package 100 of FIG. 9 comprises an electrically conductive connection body 136 which is electrically coupled with the first pad 106 by the spacer body 110 which is consequently configured as an electrically conductive clip in addition to its spacing function. For instance, spacer body 110 may be made of copper. What concerns the configuration of substrate 126, electronic component 102 and interconnection layers 160, reference is made to the description of FIG. 8.

Figure 11:
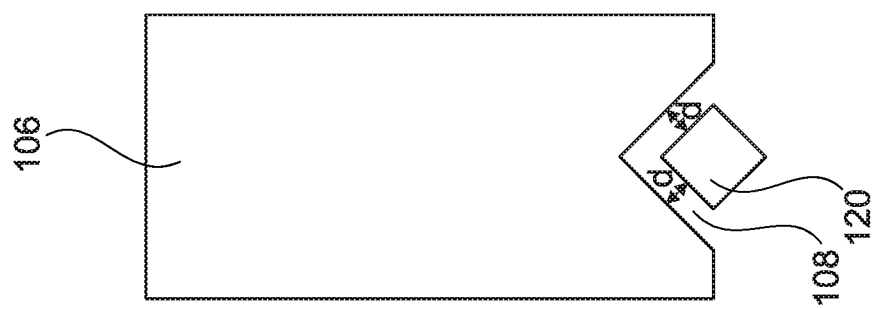
Figure 10:
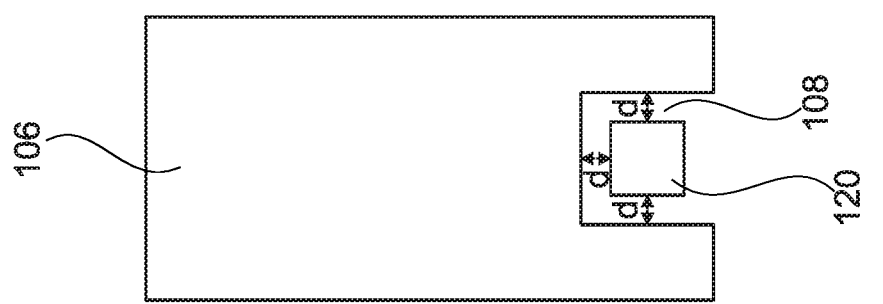

FIG. 10 to FIG. 12 shows different configurations of source pads 106 and gate pads 120 on the same main surface 104 of an electronic component 102 with substantially constant distance, d, between source pad 106 and gate pad 120 along the extension of open notch 108 of the source pad 106 according to exemplary embodiments.

Referring to FIG. 10, substantially rectangular source pad 106 has a rectangular (in particular square) notch 108 in which a rectangular (in particular square) gate pad 120 is arranged with constant distance, d, between an edge of source pad 106 and an edge of gate pad 120 along notch 108.

Referring to FIG. 11, substantially rectangular source pad 106 has a triangular notch 108 in which a rectangular (in particular square) gate pad 120 is arranged with constant distance, d, between an edge of source pad 106 and an edge of gate pad 120 along notch 108.

Referring to FIG. 12, substantially rectangular source pad 106 has a semi-circular notch 108 in which a circular gate pad 120 is arranged with constant distance, d, between an edge of source pad 106 and an edge of gate pad 120 along notch 108.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package which comprises:
    an electronic component having a first main surface with an electrically conductive first pad, the first pad having an open notch; and
    a spacer body mounted on the first pad and bridging at least part of the open notch,
    wherein the electronic component has an electrically conductive second pad on the first main surface;
    wherein the second pad is arranged so as to be substantially equidistantly spaced from the first pad along the open notch of the first pad and outside of the open notch of the first pad;
    wherein the second pad is shaped in accordance with at least one of the group consisting of a circular shape, a hexagon shape, and an octagon shape;
    wherein the first main surface has an electrically insulating region at the open notch of the first pad; and
    wherein the spacer body bridges the open notch of the first pad without direct physical contact with the electrically insulating region.

2. The package according to claim 1, comprising at least one of the following features:
    wherein the spacer body is thermally conductive and/or electrically conductive;
    wherein the spacer body is mounted in a thermally conductive and/or electrically conductive manner on the first pad of the electronic component;
    wherein the spacer body is mounted on the first pad by one of the group consisting of soldering, sintering, welding and adhering.

3. The package according to claim 1, wherein the first pad and a mounting surface of the spacer body have different geometrical shapes.

4. The package according to claim 1, wherein the first pad has a rectangular section connected with a first extension section and a second extension section, the extension sections being mutually spaced by the open notch of the first pad.

5. The package according to claim 4, wherein the spacer body is mounted on at least part of the rectangular section, at least part of the first extension section and at least part of the second extension section.

6. The package according to claim 1, wherein a mounting surface of the spacer body is rectangular.

7. The package according to claim 1, wherein the open notch of the first pad is shaped in accordance with at least one of the group consisting of rounded, trapezoid-shaped, substantially V-shaped, substantially U-shaped, and rectangular shaped.

8. The package according to claim 1, wherein the electronic component has an electrically conductive third pad on a second main surface opposing the first main surface.

9. The package according to claim 1, wherein the first pad comprises a single open notch.

10. The package according to claim 1, wherein the second pad is fully outside of the open notch.

11. A method of manufacturing a package, wherein the method comprises:
providing an electronic component having a first main surface with an electrically conductive first pad, the first pad having an open notch,
mounting a spacer body on the first pad so that the spacer body bridges at least part of the open notch,
wherein the electronic component has an electrically conductive second pad on the first main surface,
wherein the second pad is arranged so as to be substantially equidistantly spaced from the first pad along the open notch of the first pad and outside of the open notch of the first pad,
wherein the second pad is shaped in accordance with at least one of the group consisting of a circular shape, a hexagon shape, and an octagon shape,
wherein the first main surface has an electrically insulating region at the open notch of the first pad, and
wherein the spacer body bridges the open notch of the first pad without direct physical contact with the electrically insulating region.

12. The method according to claim 11, wherein the second pad is fully outside of the open notch.

13. A package, comprising:
an electronic component with an electrically conductive first pad having an open notch and with an electrically conductive second pad;
wherein the second pad is arranged so as to be substantially equidistantly spaced from the first pad along the open notch and fully outside of the open notch of the first pad; and
wherein the second pad is shaped in accordance with at least one of the group consisting of a circular shape, a hexagon shape, and an octagon shape.

14. A method of manufacturing the package of claim 1, wherein the method comprises:
providing an electronic component with an electrically conductive first pad having an open notch and with an electrically conductive second pad;
arranging the second pad so as to be substantially equidistantly spaced from the first pad along the open notch and fully outside of the open notch of the first pad, and
wherein the second pad is shaped in accordance with at least one of the group consisting of a circular shape, a hexagon shape, and an octagon shape.

\* \* \* \* \*